(12) United States Patent
Masuda

(10) Patent No.: US 8,017,936 B2
(45) Date of Patent: Sep. 13, 2011

(54) ELECTRIC DEVICE, METHOD OF MANUFACTURING ELECTRIC DEVICE AND ELECTRIC APPARATUS

(75) Inventor: Takashi Masuda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1002 days.

(21) Appl. No.: 11/613,734

(22) Filed: Dec. 20, 2006

(65) Prior Publication Data

US 2007/0148813 A1 Jun. 28, 2007

(30) Foreign Application Priority Data

Dec. 28, 2005 (JP) ................................. 2005-380424

(51) Int. Cl.
H01L 35/24 (2006.01)
(52) U.S. Cl. ...................... 257/40; 257/E51.027; 438/99
(58) Field of Classification Search .................... 438/99; 257/40, E51.027
See application file for complete search history.

(56) References Cited

U.S. PATENT DOCUMENTS 7,081,641 B2 7/2006 Kawasaki et al.
2004/0161873 A1* 8/2004 Dimitrakopoulos et al. ... 438/99
2007/0102697 A1* 5/2007 Chen et al. ...................... 257/40
2008/0157071 A1* 7/2008 Ahn et al. ........................ 257/40

FOREIGN PATENT DOCUMENTS

| JP | A 2004-006782 | 1/2004 |
| JP | A-2005-93542 | 4/2005 |
| JP | A 2005-294785 | 10/2005 |

OTHER PUBLICATIONS

Miura et al, "Wettabilities of Self-Assembled Monolayers Generated from CF3-Terminated Alkanethiols on Gold," Langmuir 14 (1998): pp. 5821-5825.*

* cited by examiner

Primary Examiner — Matthew Landau
Assistant Examiner — Colleen E Snow
(74) Attorney, Agent, or Firm — Oliff & Berridge, PLC

(57) ABSTRACT

An electric device includes: a pair of electrodes, an organic semiconductor film and an organic film formed on a surface of at least one of the electrodes, wherein the organic this film includes a nonconjugated organic compound having a plurality of coupling groups coupled with the electrodes.

17 Claims, 7 Drawing Sheets

ELECTRIC DEVICE, METHOD OF MANUFACTURING ELECTRIC DEVICE AND ELECTRIC APPARATUS

BACKGROUND

1. Technical Field

The present invention relates to an electric device, a method of manufacturing an electric device and an electric apparatus.

2. Related Technology

JPA2004-6782 discloses a thin film transistor formed with an organic semiconductor material, which has recently attracted attention as a device being replaced with a transistor formed with an inorganic semiconductor material.

Such thin film transistor includes an organic semiconductor film with contacting source and drain electrodes.

In general, these source and drain electrodes are made of metal, having high activity (high reactivity) with an organic material. These electrodes is reacted with an organic material constituting an organic semiconductor film because of the above reason, deteriorating and deforming the property of an organic semiconductor material and worsening the characteristics of a thin film transistor with age.

This problem is also occurred in other electric devices provided with an organic semiconductor film.

SUMMARY OF THE INVENTION

The advantage of the invention is to provide an electric device having superior characteristics and a structure preventing the characteristics from deteriorating with time in an atmosphere, a method of manufacturing such electric device and an electric apparatus.

A main aspect of the present invention is described below . . . .

A first aspect of the invention, an electric device includes: a pair of electrodes; an organic semiconductor film; and an organic film formed on a surface of at least one of the electrodes, wherein the organic film includes a nonconjugated organic compound having a plurality of coupling groups coupled to the electrodes.

The aspect of the invention provides an electric device having superior characteristics and a structure preventing the characteristics from deteriorating with time in an atmosphere.

The electric device of the above aspect may include the pair of electrodes constituting source and drain electrodes and a transistor provided with an gate electrode applying an electric field to the organic semiconductor film.

The electric device of the above aspect may be applied to various things, in particular to a transistor.

In the electric device of the above aspect, the surface of the electrode on which the organic film is formed, may include a part of area where the coupling groups are not coupled to the surface.

This structure improves the efficiency of exchanging electric charges between electrodes and the organic semiconductor film via the organic film.

In the electric device of the above aspect, the surface of the electrode on which the organic film is formed, may include a part of area where the coupling groups are coupled to the surface.

This structure improves the efficiency of exchanging electric charges between electrodes and the organic semiconductor film via the organic film.

In the electric device of the above aspect, the coupling groups may be a SH group.

The SH group strongly couples with metals in particular, enhancing adhesiveness of an organic film to electrodes when the organic compound including the SH group is used as a coupling group.

In the electric device of the above aspect, the nonconjugated organic compound may include a substitution group supplying electric charges to the organic semiconductor at the opposite side of the coupling group.

This structure further improves the efficiency of handling electric charges between electrodes and the organic semiconductor film via the organic film.

In the electric device of the above aspect, the maximum thickness of the organic film may be smaller than the length between the coupling group of the nonconjugated organic compound and the substitution group.

This structure prevents characteristics of a thin film transistor from deteriorating even when insulation of the organic film relatively become high, since its thickness is thin.

In the electric device of the above aspect, the nonconjugated organic compound may include a structure having hydrophobicity at the opposite side of the coupling group.

This structure prevents the surface of the electrode in the electric device from being adhered with water, even when the device is exposed to a high-moisture environment in the atmosphere. As the result, deterioration of characteristics of the electric device due to adhesion of water to the electrodes can be avoided.

In the electric device of the above aspect, the nonconjugated organic compound may be expressed as the general formula: $CF_3(CF_2)_m(CH_2)_nCH(CH_2SH)_2$, where m is integers from one to thirty five and n is integers from two to thirty three.

The organic film is formed with the above nonconjugated organic compound as a main material, giving superior characteristics to the electric device and certainly maintaining such superior characteristics even when the device is exposed to a relatively-high-moisture environment.

In the electric device of the above aspect, in the general formula, the ratio of m/n may satisfy the numbers from 0.25 to 18.

This satisfaction sufficiently increases the ratio of the fluoro group in the molecular structure of the nonconjugated organic compound expressed as the above formula, showing sufficient hydrophobicity, for example.

In the electric device of the above aspect, the nonconjugated organic comound includes carbons of which total numbers are 4 to 45.

This structure certainly prevents electrodes from being contacted with the organic semiconductor film and the insulation of the organic film from becoming high, avoiding deterioration of the characteristics of an electric device.

In the electric device of the above aspect, the numbers of the nonconjugated organic compound coupled to the surface of the electrode on which the organic film is formed, may be from $0.05 \times 10^{15}$ to $0.96 \times 10^{15}$ pieces/cm$^2$.

This structure improves the efficiency of handling electric charges between electrodes and the organic semiconductor film via the organic film.

In the electric device of the above aspect, direct contact of the electrode, on which the organic film is formed, with the organic semiconductor film may be prohibited due to the existence of the organic film.

This structure prevents an organic semiconductor material constituting an organic semiconductor film from reacting with electrodes, avoiding deterioration and deformation of an organic semiconductor film. As a result, deteriorating the characteristics of a thin film transistor in time can be preferably avoided.

In the electric device of the above aspect, the electrode, on which the organic film is formed, may be made of one of Au, Ag, Cu, Pt and alloy including these metals.

These materials are preferable since they easily couple with an organic compound constituting an organic film.

According to a second aspect of the invention, a method of manufacturing an electric device having a pair of electrodes and an organic semiconductor film, comprising: a) forming an organic film by coupling a nonconjugated organic compound having at least a plurality of coupling groups with a surface of at least one of the pair of electrodes; b) forming the semiconductor film with contacting the organic film.

The aspect of the invention provides an electric device having superior characteristics and a structure preventing the characteristics from deteriorating with time in an atmosphere.

The method of manufacturing an electric device in the above aspect, may further include: c) cleaning at least the surface of the electrode on which the organic film is formed with oxygen plasma before the step a).

Treating the surface of the electrodes with oxygen plasma forms corrugated surfaces and defects on the surface of the electrodes, which is uneasy to couple with an organic compound constituting a organic film, easily controlling coupling speed (reacting speed) of an organic compound to the electrodes and coupling density thereof.

The method of manufacturing an electric device according to the above aspect, in the step a), the organic film may be formed by holding a liquid for forming an organic film contacted with the surface of the electrode on which the organic film is formed during 0.1 to 200 minutes and the liquid includes the nonconjugated organic compound with the density of 0.01 to 10 mM.

This structure improves the efficiency of handling electric charges between electrodes and the organic semiconductor film via the organic film.

An electric apparatus of the invention is provided with the electric device of the invention. This apparatus can show a highly reliable electric apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the invention with respect to an electric device, a method of manufacturing an electric device, an electric apparatus will be described accompanying drawings.

First Embodiment

First, an electric device of the invention is applied to a thin film transistor.

Figure 1A:
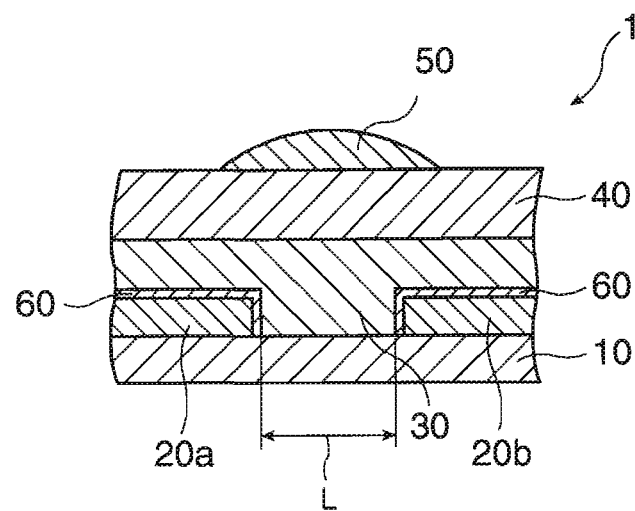
FIGS. 1A to 1B are schematic views of a first embodiment of applying the electric device of the invention to a thin film transistor
Figure 1B:
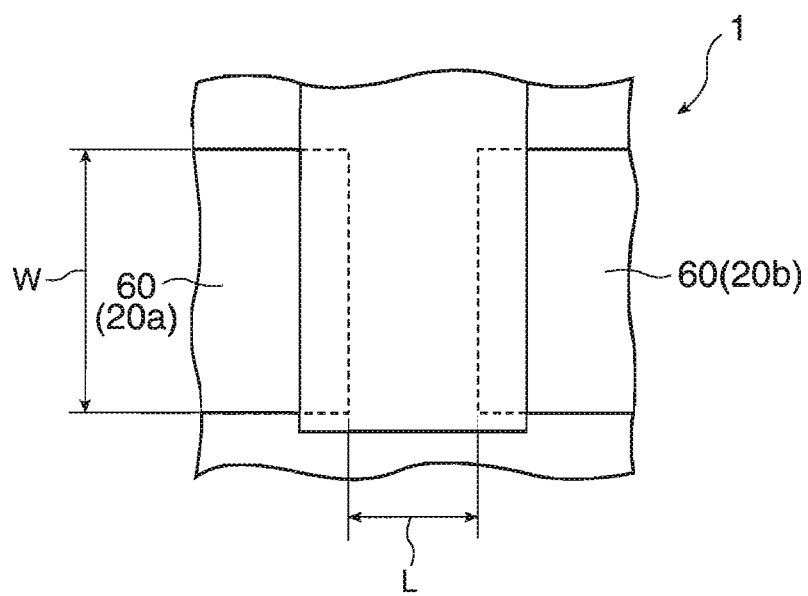

FIGS. 1A and 1B are schematic views showing a first embodiment in which an electric device of the invention is applied to a thin film transistor. FIG. 1A is a cross sectional view and FIG. 1B is a plain view. FIG. 2 and FIG. 3 are cross sectional views for explaining a method of manufacturing a thin film transistor shown in FIG. 1.

A transistor 1 in FIG. 1 is a top gate type thin film transistor formed on a substrate 10, including a source electrode 20a, a gate drain electrode 20b, an organic semiconductor film 30, a gate electrode 50 and a gate insulation layer 40. The source electrode 20a is separated from the gate drain electrode 20b. The organic semiconductor film 30 is formed covering over the source electrode 20a and the gate drain electrode 20b. The gate insulation layer 40 is located between the organic semiconductor film 30 and the gate electrode 50.

Each element will now be described in detail.

The substrate 10 supports each layer (each element) making up the thin-film transistor 1.

Examples of the material of the substrate 10 includes a glass substrate; a plastic substrate (a resin substrate) containing polyethylene terephthalate (PET), polyethylene naphthalate (PEN), polyethersulphone (PES), aromatic polyester (liquid crystal polymer), polyimide (PI), or the like; a quartz substrate; a silicon substrate, a metal substrate; and a gallium arsenide substrate.

In order to provide flexibility to the thin-film transistor 1, the substrate 10 is a plastic substrate or a thin metal substrate whose thickness is comparatively small.

A pair of electrodes (the source electrode 20a and the drain electrode 20b) is formed on the substrate 10. Namely, the source electrode 20a and the drain electrode 20b is formed on the approximately same surface.

As the materials for the source electrode 20a and the drain electrode 20b, Au, Ag, Cu, Pt, Ni, Cr, Ti, Al and an alloy including these metals are cited. Combination of one or two kinds selected from them is also used.

In particular, as a material for the source electrode 20a and the drain electrode 20b, Au, Ag, Cu, Pt and an alloy including these metals are preferable. These materials are preferable since they easily couple with a nonconjugated organic compound described later. Further, these metals have a relatively-high working function, improving injection efficiency of holes (carriers) into the organic semiconductor film 30, if the organic semiconductor film 30 is p type and the source electrode 20a is made of one of these metals, described later.

The average thickness of the source electrode 20a and the drain electrode 20b is not limited. But, it is preferably from 10 to 2000 nm, and more preferably from 50 to 1000 nm.

The source electrode 20a and the drain electrode 20b are refereed to as electrode 20 hereafter. An organic film 60 is formed on the surface of the electrode 20.

The organic film 60 includes a nonconjugated organic compound (a nonconjugated organic molecule) having at least a plurality of coupling groups coupled to the surface of the electrode 20. Namely, the organic film 60 may be a nonconjugated organic compound or a structure having a nonconjugated organic compound and other compounds. Here, the organic film 60 is preferably made of a nonconjugated organic compound.

Forming the organic film 60 on the surface of the electrode 20 prevents the electrode from being contacted with the organic semiconductor film 30. This structure prevents the organic semiconductor material constituting the organic semiconductor film 30 from reacting with the electrode 20, avoiding deterioration and deformation of the organic semiconductor film 30. As a result, deteriorating the characteristics of the thin film transistor 1 in time can be preferably avoided.

Further, forming the organic film 60 prevents the surface of the electrode 20 from being attached with water and stain. As the result, the characteristics of the thin film transistor 1 can be improved. Further, the organic film 60 can maintain a uniform surface on the molecular level, preventing the characteristics of a thin film transistor from fluctuating. As the result, an electric apparatus such as display described later in which such thin film transistor 1 is incorporated has improved reliability.

According to the embodiment, in particular, the nonconjugated organic compound includes a plurality of coupling groups coupled to the electrode 20. Hence, the compound can strongly adhere to the electrode 20 comparing to a compound having a single coupling group. As a result, easily detaching the organic film 60 from the electrode 20 can be avoided.

Here, if the thin film transistor 1 is under the atmosphere having relatively high moisture, water in the atmosphere gets into the inside of the thin film transistor 1 in time (moisture adsorption) and adheres to the surface of the electrode 20. Then, the nonconjugated organic compound is removed from the surface since a portion of coupling to the surface of the electrode 20 is dissolved. When this removing is large, the characteristics of the thin film transistor 1, is deteriorated (the OFF current increases in particular.)

The embodiment, however, uses the nonconjugated organic compound having a plurality of coupling groups, strongly coupling the nonconjugated organic compound (the organic film 60) to the surface of the electrode 20 as described before. This coupling certainly prevents the characteristics of the thin film transistor 1 from deteriorating in time (in the atmosphere in particular) and improves the stability of it in the atmosphere.

Further, on the surface of the electrode 20, there preferably exists a part in which coupling groups as described later is not coupled, namely a part in which coupling groups (the nonconjugated organic compound) is coupled. In general, a film including the nonconjugated organic compound (a film of which a main material is the nonconjugated organic compound in particular) shows high insulation. But, there exists a part in which the nonconjugated organic compound is coupled, efficiently exchanging holes (electric charges) between the electrode 20 and the organic semiconductor film 30 via the organic film 60.

Namely, holes are efficiently injected into the organic semiconductor film 30 from the source electrode 20a and they are transferred into the drain electrode 20b from the organic semiconductor film 30 via the organic film 60, gaining sufficient drain current (ON current) in the thin film transistor 1.

The organic film 60 preferably satisfies one of the following conditions I and II or more preferably both of them.

The organic film 60 is formed by holding a liquid for organic film including nonconjugated organic compound contacted with the surface of the electrode 20 preferably during 0.1 to 200 minutes more preferably 1 to 150 minutes, further preferably 6 to 60 minutes. The liquid has 0.01 to 10 mM density of the compound.

The numbers of nonconjugated organic compounds coupled to the surface of the electrode 20 is preferably from $0.05\times10^{15}$ to $0.96\times10^{15}$ pieces/Cm$^2$ more preferably $0.20\times10^{15}$ to $0.94\times10^{15}$ pieces/cm$^2$, further preferably $0.50\times10^{15}$ to $0.92\times10^{15}$ pieces/cm$^2$.

These conditions satisfies that the organic film 60 sufficiently prevent the electrode 20 from contacting the organic semiconductor film 30, efficiently exchanging holes (carriers) between the electrode 20 and the organic semiconductor film 30 via the organic film 60.

Such nonconjugated organic compound includes a plurality of coupling groups (at least two) at the end of the side coupled to the surface of the electrode 20. Such coupling groups is a thing that forms chemical compound with metal constituting the electrode 20, not limited to a specific thing. A SH group, a RO group (R stands for alkyl), a SiOR group are cited, SH group is preferably cited. The SH group strongly couples with metals in particular, enhancing adhesiveness of the organic film 60 to the electrode 20 when the organic compound including the SH group is used as a coupling group.

The nonconjugated organic compound preferably includes a substituting group (a substituting group having dopant property) that locates at a side opposite to the side coupled to the surface of the electrode 20 and supplies holes (electric charges) to the organic semiconductor 30. This structure further improves the efficiency of exchanging electric charges between electrode 20 and the organic semiconductor film 30 via the organic film 60.

Such nonconjugated organic compound preferably includes a structure having hydrophobicity at the side opposite to the side coupled to the surface of the electrode 20. This structure further prevents the surface of the electrode 20 in the thin film transistor 1 from being adhered with water, even when the thin film transistor 1 is exposed to a high-moisture environment in the atmosphere. As the result, deterioration of characteristics of the thin film transistor 1 due to adhesion of water to the electrodes can be certainly avoided.

In consideration of these situations, the nonconjugated organic compound preferably includes a fluoro group at the side opposite to the side coupled to the surface of the electrode 20. According to the fluoro group, the nonconjugated organic compound preferably achieves both dopant property and hydrophobicity only by introducing one kind of functional groups at the side opposite to the side coupled to the surface of the electrode 20.

Further, the nonconjugated organic compound preferably includes two coupling groups. Such nonconjugated organic compound is desirable since it is easily synthesized and has high yield constant. On these situations, the nonconjugated organic compound is preferably a compound that includes the SH group as a coupling group coupled to the surface of the electrode 20 and the fluoro group at the opposite side of the SH group. Such compound is more preferably expressed as the formula: $CF_3(CF_2)_m(CH_2)_n\ CH(CH_2SH)_2$, where m is integers from one to thirty five and n is integers from two to thirty three. Such nonconjugated organic compound shows both high dopant property and hydrophobicity. Therefore, forming the organic film 60 by using the nonconjugated organic compound as a main material gives high valued drain current (ON current) to the thin film transistor 1 and certainly maintain its excellent property even if it is exposed to a high-moisture atmosphere.

Further, in the general formula, m/n preferably satisfies 0.25 to 18, more preferably 0.25 to 10 and further preferably 1 to 7. This satisfaction sufficiently increases the ratio of the fluoro group in the molecular structure of the nonconjugated organic compound expressed as the above formula, showing sufficient hydrophobicity.

Further, the total numbers of carbons in the nonconjugated organic compound is preferably from 4 to 45, more preferably 10 to 42. If total numbers of carbons are too small, the organic film 60 may not sufficiently prevent the electrode 20 from contacting the organic semiconductor film 30 depending on the numbers of the nonconjugated organic compounds coupled to the surface of the electrode 20. On the other hand, If total numbers of carbons are too large, the insulation of the organic film 60 may be unnecessarily high, deteriorating the characteristics of the thin film transistor 1.

Here, as the nonconjugated organic compounds, saturated hydrocarbon or its derivatives can be used, for example. As this derivatives, compounds in which any of the OH group, the $NH_2$ group, the COOH group is introduced at the end opposite to the SH group are cited.

The distance between the source electrode 20a and the drain electrode 20b on which the organic film 60 is formed, namely a channel length L shown in FIG. 1 is preferably 2 to 30 μm, more preferably 2 to 20 μm. Such setting the value of the channel length L, in the above ranges improves the characteristics of the thin film transistor 1 (increase of ON current in particular.)

Further, the length of the source electrode 20a and the drain electrode 20b on which the organic film 60 is formed, namely a channel width W shown in FIG. 1 is preferably 0.1 to 1 mm, more preferably 0.3 to 3 mm. Such setting the value of the channel width W in the above ranges reduces parasitic capacitance, preventing the characteristics of the thin film transistor 1 from deteriorating. Further, the thin film transistor 1 can be downsized.

The organic semiconductor film 30 is formed on the substrate 10, covering over the source electrode 20a and the drain electrode 20b and contacting the organic layer 20.

In the embodiment, the organic semiconductor film 30 is mainly made of a p-type organic semiconductor material. As the p-type organic semiconductor material, both polymer organic semiconductor materials and low-molecular-weight organic semiconductor materials can be used here.

As polymer organic semiconductor materials, poly(3-hexyl thiophene) (P3HT), poly(3-octylthiophenxe) poly(2,5-thienylenevinylene) (PTV), poly(para-phenylenevinylene) (PPV), poly(9,9-dioctylflorene) (PFO), poly(9,9-diocty florene-corbis-N,N'-(4-methoxy-phenyl)-bis-N,N'-phenyl-1,4-phenylenediamine) (PFMO), poly(9,9-dioctylflorene-co-benzothiadiazole) (BT), florene-triallylamine copolymer, triallylamine polymer, florene-bithiophene copolymer (F8T2) are cited.

As low-molecular-weight organic semiconductor materials, C60, metal phthalocyanine or its substituted derivative, acene molecule materials such as anthracene, pentacene and hexacene, and α-oligothiophene group such as quarter-thiophene (4T), sexithiophene (6T), octathiophene (8T), dihexyl quarterthiophene (DH4T), dihexyl sexithiophene (DH6T) are cited.

Among these materials, an organic semiconductor material having a thiophene structure is preferably used as a main material for the p type organic semiconductor film 30. The organic semiconductor material having a thiophene structure has high carrier mobility, improving the characteristics of the thin film transistor 1 since the organic semiconductor film 30 is formed by using such organic semiconductor material as a main material.

The organic semiconductor material, having a thiophene structure is highly reactive to metals. Hence, it is specifically efficient that the embodiment is applied to the thin film transistor 1, which is provided with the organic semiconductor film 30 formed by using such semiconductor material as a main material.

Further direct contact of the organic semiconductor film 30 to the organic film 60 improves the efficiency of exchanging holes (carriers) between the electrode 20 and the organic semiconductor film 30. As the result, the characteristics of the electron transportation layer 1 are further improved.

The average thickness of the organic semiconductor film 30 is not limited. But, it is preferably from 0.1 to 1000 nm, more preferably from 1 to 500 nm and further preferably from 1 to 100 nm.

A gate insulation layer (an insulation layer) 40 is formed on the organic semiconductor film 30, namely a side opposite to the source electrode 20a and the drain electrode 20b via the organic semiconductor film 30.

The gate insulation layer (an insulation layer) 40 insulates a gate electrode (a third electrode) 50, which is described later, from the source electrode 20a and the drain electrode 20b.

Examples of materials of the gate insulation layer 40 are any organic and inorganic materials as long as they are known as gate insulating materials.

As organic materials, polymethyl methacrylate, polyvinyl phenol, polyimide, polystyrene, polyvinyl alcohol, polyvinyl acetate, and one or two combinations of them are cited.

As inorganic materials, metal oxides such as silica, silicon nitride, aluminum oxide, metal compound oxides such as barium strontium titanat, lead zirconate titanate tantalum and one or two combinations of them are cited.

The average thickness of the gate insulation layer 40 is not limited. But, it is preferably from 10 to 5000 nm, and more preferably from 100 to 2000 nm. The above range of the thickness of the gate insulation layer 40 certainly insulates the gate electrode 50 from the source electrode 20a and the drain electrode 20b and lowers the operating voltage of the thin film transistor 1.

The gate insulation layer 40 is not limited to a single layer, but may be a multiple layered structure.

The gate electrode 50 is provided at a specific position on the gate insulation layer 40, namely, corresponding to a region between the gate electrode 20a and the drain electrode 20b.

Examples of materials of the gate electrode 50 are not specifically limited as long as they are known as electrode materials. Specifically, Cr, Al, Ta, Mo, Nb, Cu, Ag, Au, Pd, In, Ni, Nd, Co, metal materials such as alloys including these elements, and these oxides are used.

Alternatively, conductive organic materials may be used for the gate electrode 50. The average thickness of the gate electrode 50 is not specifically limited. But, it is preferably from 0.1 to 2000 nm, and more preferably from 1 to 1000 nm.

With a voltage applied in between the source electrode 20a and the drain electrode 20b of the thin-film transistor 1, applying a gate voltage to the gate electrode 50 makes a channel in the organic semiconductor film 30 near the interface with the gate insulation layer 40. As carriers (holes) move in this channel region, a current flows between the source electrode 20a and the drain electrode 20b. More specifically, when a voltage is applied in between the source electrode 20a and the drain electrode 20b with no voltage being applied to the gate electrode 50, namely OFF state, only a small amount of current flows, since there are few carriers in the organic semiconductor film 30.

On the other hand, when voltage is applied to the gate electrode 50 namely ON state, electric charges are induced to a region where the organic semiconductor film 30 faces the gate insulation layer 40 to form a channel (a path for carriers.) Under this state, if a voltage is applied in between the source electrode 20a and the drain electrode 20b, a current flows through the channel.

The thin film transistor 1 can be manufactured by the following process, for example. The process for manufacturing the thin film transistor 1 shown in FIG. 1 includes a step [A1] for forming the source electrode 20a and the drain electrode 20b on the substrate 10, a step [A2] for forming the organic film 60 on the surface of the source electrode 20a and the drain electrode 20b, a step [A3] for forming the organic semiconductor film 30 with covering over the organic film 60 where the source electrode 20a and the drain electrode 20b is formed, a step [A4] for forming the gate insulation layer 40 on the organic semiconductor film 30, and a step [A5] for forming the gate electrode 50 on the gate insulation layer 40.

[A1] Step for Forming Source Electrode and Drain Electrode

Figure 2A:
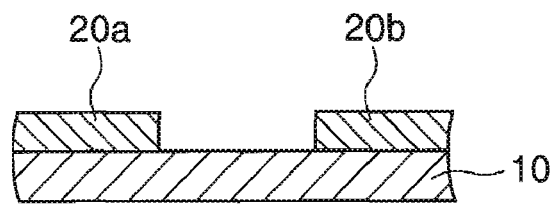
FIGS. 2A to 2C are cross sectional views explaining a method of manufacturing thin film transistors shown in FIG. 1.

First, the source electrode 20a and the drain electrode 20b are formed on the substrate 10 (see FIG. 2A.) The source electrode 20a and the drain electrode 20b are formed by etching or lift off method.

In case of forming the source electrode 20a and the drain electrode 20b by etching, a metal film is deposited over the all surface of the substrate 10 by sputtering, evaporation or plating. II. Next, a photo resist layer is deposited on the metal film (the surface) by using a photolithography, micro contact printing, for example. III. Then, the metal film is etched and patterned to have a specific pattern by using the resist layer as a mask.

In a case of forming the source electrode 20a and the drain electrode 20b by a lift off method, I.: a resist layer is firstly formed over a region except the region where the source electrode 20a and the drain electrode 20b are formed. II. Next, a metal film (a metal layer) is deposited on the all surface of the substrate 10 at a resist side by using a evaporation and plating. III. Then, the resist layer is removed.

[A2] Forming Organic Film (A First Step)

Figure 2B:
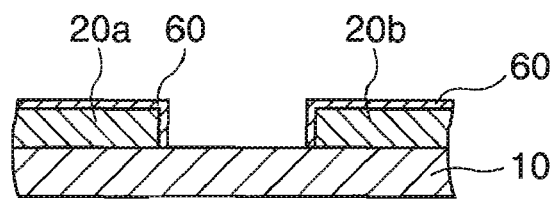

Next, the organic film 60 is formed on the surface of source electrode 20a and the drain electrode 20b (see FIG. 2B.) First, the substrate 10 where the source electrode 20a and the drain electrode 20b are formed is cleaned. As a method of cleaning the substrate 10 (the electrode 20), cleaning with a cleaning fluid, oxygen plasma treatment, an argon plasma treatment and an ultra violet ozone treatment are cited. The substrate may be cleaned by one of the above methods or any of two combinations among them. For example, after cleaning the substrate 10 with a cleaning fluid and dry it, the substrate is treated by at least one of oxygen plasma, argon plasma and ultra violet ozone. Namely such plural cleanings highly cleans the surface of the source electrode 20a and the drain electrode 20b.

Among these methods for cleaning the substrate 10 (the electrode 20), the oxygen plasma treatment is preferable. If the surface of the electrode 20 is treated by oxygen plasma, concave and convex portions and defects portions are formed on the surface of the electrode 20. These portions are uneasy coupled to the nonconjugated organic compound comprising the organic film 60. This treatment easily controls the speed of coupling (reacting speed) the nonconjugated organic compound to the surface of the electrode 20, easily setting the coupling numbers of the nonconjugated organic compound within the rage described above. As the result, the characteristics of the thin film transistor 1 can be improved.

In particular, some parts of straight chains of the nonconjugated organic compound are not easily elected vertically to the surface of the electrode 20, but declined. As the result, this structure prevents characteristics of the thin film transistor 1 from deteriorating even when insulation of the organic film relatively becomes high, since its thickness is thin.

For example, when the nonconjugated organic compound has the substituting group described above (the substituting group including dopant property), the maximum thickness of the organic group 60 is preferably small than the distance between the coupling group of the nonconjugated organic compound and the substitution group. This structure further improves the efficiency described above.

The conditions for oxygen plasma treatment are the followings, for example.

A gas for treatment is pure oxygen. Further, the amount of gas flow for treatment is from 10 to 500 sccm, more preferably 50 to 400 sccm. Further, the RF power is from 0.005 to 0.2 W/cm$^2$, more preferably 0.05 to 0.1 W/cm$^2$.

Further, the period for oxygen plasma treatment is from 1 to 600 seconds, more preferably 180 to 360 seconds. Further, the atmospheric temperature for oxygen plasma treatment is from 0 to 100° C., and more preferably 20 to 50° C. Further, the atmospheric pressure for oxygen plasma treatment is preferably under reduced pressure ($1\times10^{-1}$ Pa for example.)

Next, an liquid for forming the organic film including the above nonconjugated organic compound (a liquid for treatment) is contacted to the surface of the electrode 20. This contact makes a metal material constituting the electrode 20 react with coupling group included in the nonconjugated organic compound, and the nonconjugated organic compound be coupled to the surface of the electrode 20, forming the organic film 60. Methods of contacting a liquid for forming the organic film with the surface of the electrode 20 are the followings for example. The substrate 10 is dipped into a liquid for forming the organic film. A liquid for forming the organic film is sprayed on the substrate 10. The surface of the substrate 10 on which the electrode 20 is contacted with a liquid for forming the organic film. As a solvent for adjusting a liquid for forming the organic film, ethanol, chloroform, dichloromethane, dimethylformamide, 1,4-dioxane, butyl acetate, xylene, toluene, propanol, and water are cited.

[A3] Forming Organic Semiconductor Film (A Second Step)

Figure 2C:
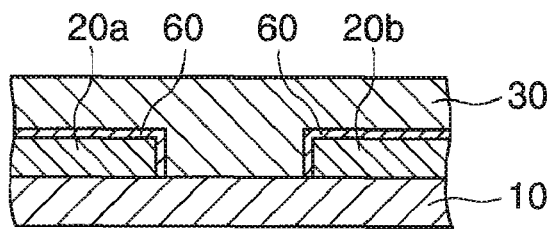

Next, the organic semiconductor film 30 is formed, as covering over the source electrode 20a and the drain electrode 20b on which the organic film 60 is formed and contacting the organic film 60 (see FIG. 2C). Here, a channel region is formed in between the source electrode 20a and the drain electrode 20b.

The organic semiconductor film 30 is made of a polymer organic semiconductor material, for example, by application methods such as spin coating and dipping, or printing methods such as ink jetting and screen printing.

Alternatively, the organic semiconductor film 30 may be made of a low-molecular-weight organic semiconductor material deposited by vapor deposition or using its precursor. More specifically, a solution including the precursor is coated by coating such as spin coating or dipping, or printing such as ink jetting and screen printing, and then the coated film is annealed.

The area in which the organic semiconductor film 30 is formed is not limited to what is described in the drawing. The organic semiconductor film 30 may be selectively formed only in a region (channel region) between the source electrode 20a and the drain electrode 20b. When providing more than one thin-film transistor 1 (element) on the same substrate, this structure makes it possible to form the organic semiconductor film 30 of each element independently, and thereby reducing leak current and crosstalk among the elements. Also, this also reduces the amount of the organic semiconductor material that is used, and thereby cutting manufacturing cost.

[A4] Forming Gate Insulation Layer

Figure 3D:
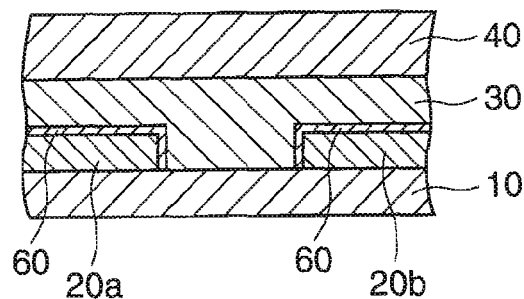
FIGS. 3D to 3E are cross sectional views explaining a method of manufacturing thin film transistors show in FIG. 1.
Figure 3E:
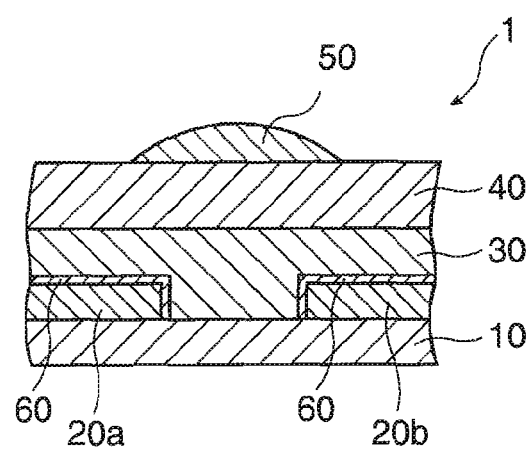

Next, the gate electrode 40 is formed on the organic semiconductor film 30 as shown in FIG. 3D.

For example, in case when the gate insulation layer 40 is made of an organic polymer material, the layer 40 is formed by applying the organic polymer material or a solution containing its precursor so as to cover the organic semiconductor film 30, and then providing a necessary treatment (e.g. heating, irradiation of infrared rays, application of ultrasonic waves) to this coated film.

The organic polymer material or solution containing its precursor is applied to the surface of the organic semiconductor film 30 by the application and printing methods described in the step [A3]. The gate insulation layer 40 may also be formed with an inorganic material by thermal oxidation, CVD, or spin-on glass (SOG). It is possible to form a silica film and a silicon nitride film as the gate insulation layer 40 through wet processing using polysilazane as a material.

[A4] Forming Gate Electrode

Next, the gate electrode 50 is formed on the gate insulation film 40 as shown in FIG. 3 E. First, a metal film (metal layer) is formed. This formation can be achieved by the following methods, for example: chemical vapor deposition (CVD) including plasma CVD, thermal CVD, and laser CVD; vacuum deposition; sputtering (low-temperature sputtering); dry plating such as ion plating; wet plating including electrolytic plating, immersion plating, and electroless plating; spraying; sol-gel processing; metalorganic deposition; and joining of metal foil.

A resist material is applied to the metal film, and hardened. Thus the resist layer having the shape corresponding to the gate electrode 50 is formed. Unnecessary portions of the metal film are removed by using the resist layer as a mask. This removing the metal film can be attained by the following methods; a physical method such as plasma etching, reactive ion etching, beam etching, photo assist etching: a chemical etching such as wet etching and one or more than two combinations of them.

Then, the gate insulation film 50 is obtained by removing the resist layer. The gate insulating layer 40 may be formed by applying conductive particles and conductive material including conductive organic material and then providing a necessary treatment (e.g. heating, irradiation of infrared rays, and application of ultrasonic waves) to this coated film. As the conductive material containing conductive particles, solutions in which metal micro particles are dispersed and polymer mixtures containing conductive particles are cited. Examples of the conductive material containing a conductive organic material include a solution or dispersion liquid of the conductive organic material. The conductive material is applied to the surface of the gate insulation layer 40 by the application and printing methods described in the step [A3]. The thin film transistor 1 of the embodiment can be formed by the processes described above.

In the embodiment, the organic film 60 is formed on both the source electrode 20a and the drain electrode 20b. But, alternatively, the organic film 60 may be selectively formed on the surface of the source electrode 20a, and not be formed on the surface of the drain electrode 20b. Further, n-type organic semiconductor film is used as the organic semiconductor film 30 by selecting appropriate organic compounds constituting the organic film 60.

Second Embodiment

Figure 4:
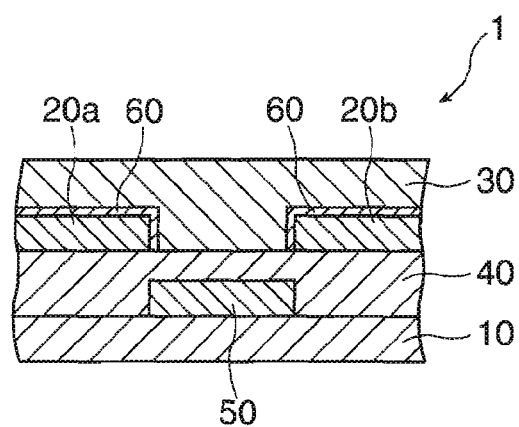
FIG. 4 is a schematic cross view of a second embodiment of applying the electric device of the invention to a thin film transistor.

A second embodiment of applying the electric device of the invention to a thin film transistor is explained. FIG. 4 is a cross section of a schematic view of the second embodiment of applying the electric device of the invention to a thin film transistor The difference of the second embodiment from the first embodiment will be mainly explained, the same contents of them are omitted. Overall structure of the thin film transistor 1 in the second embodiment is different from the first one. But other than that is the same in the first embodiment. As shown in FIG. 4, the thin film transistor 1 is a bottom gate type thin film transistor where the gate electrode 50 is located at the substrate 10 side via the gate insulation layer 40 far from the source electrode 20a and the drain electrode 20b. The organic film 60 is formed on the surface of the source electrode 20a and the drain electrode 20b similar to the first embodiment.

The thin film transistor 1 is formed by a method similar to the method described in the first embodiment. The thin film transistor 1 of the second embodiment has functions and effects similar to the first embodiment. Here, the electric device of the invention is applied not only to the above mentioned thin film transistor, but to an organic EL element, a photo electron conversion element and the like.

[Electro Optic Device]

Figure 5:
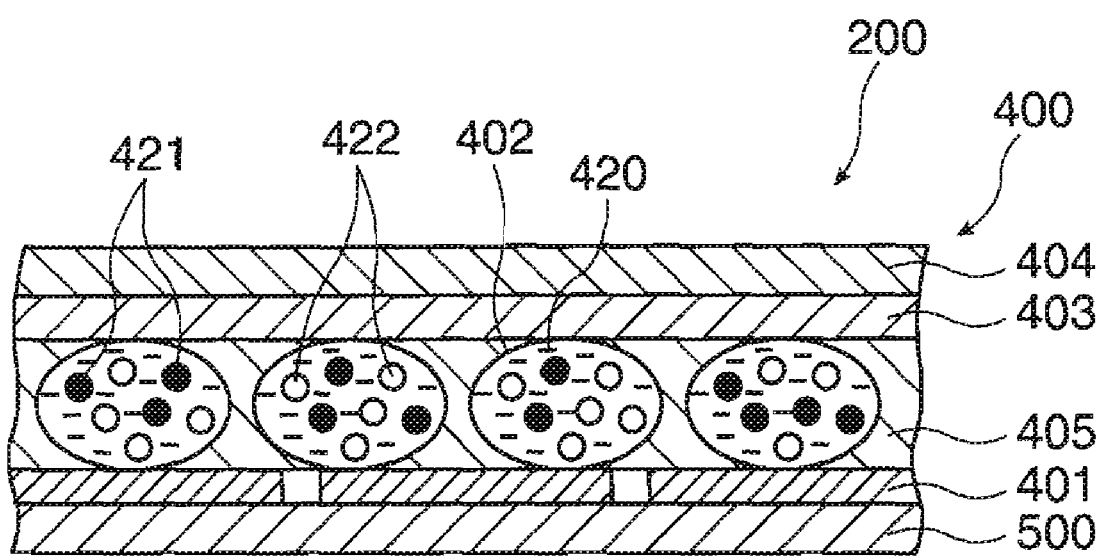
FIG. 5 is a cross sectional view of the electrophoretic display of the embodiment.
Figure 6:
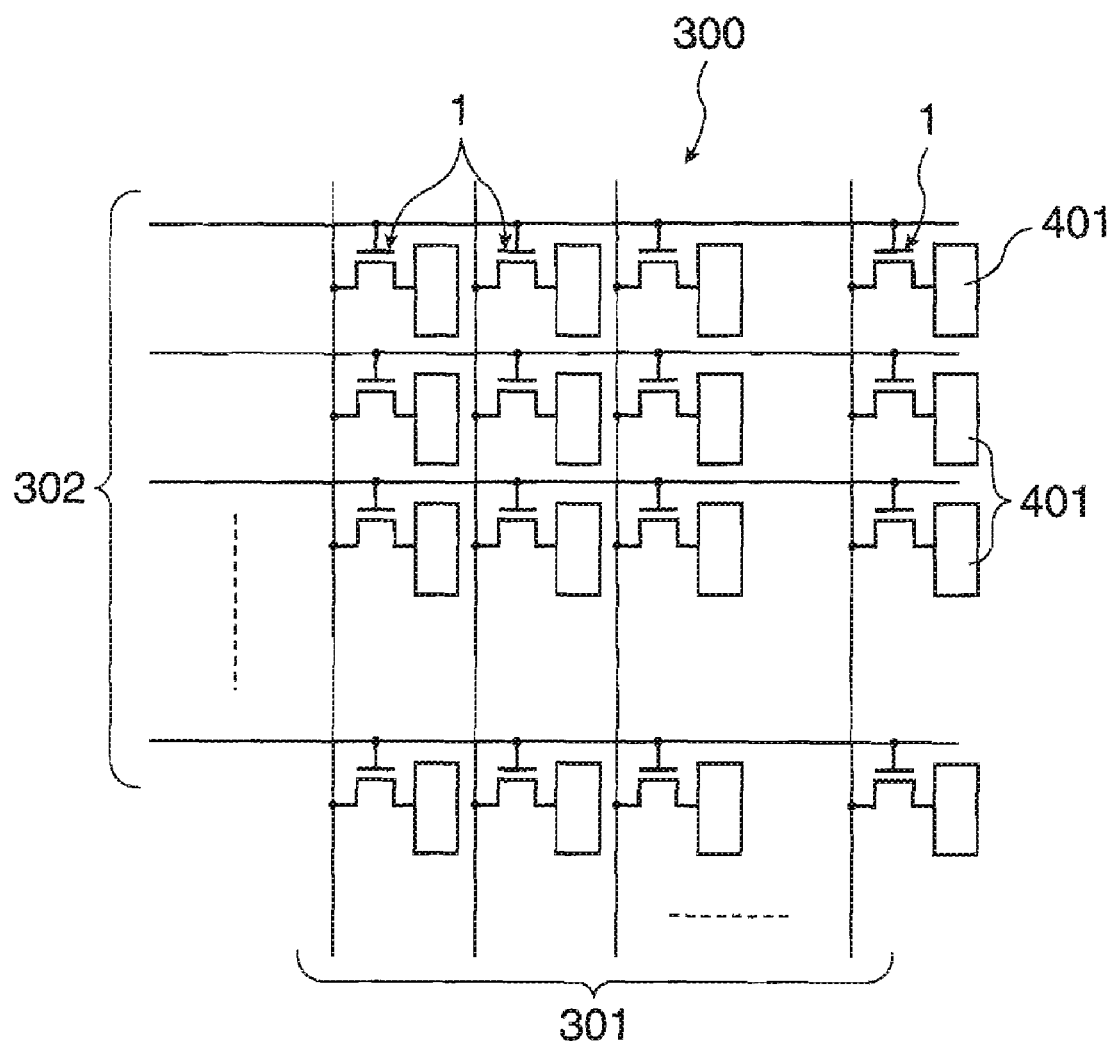
FIG. 6 is a block diagram showing the active matrix device providing the electrophoretic display shown in FIG. 5.

Next, a display equipped with an active matrix device having the thin-film transistor 1 will now be described. Here, an electrophoretic display device is given as an example. FIG. 5 is a cross sectional view of the electrophoretic display of the embodiment. FIG. 6 is a block diagram showing the active matrix device providing the electrophoretic display shown in FIG. 5. An electrophoretic display 200 shown in FIG. 5 comprises an active matrix device 300 formed oil the substrate 500 and an electrophoretic display portion 400 connected to the active matrix device 300.

As shown in FIG. 6, the active matrix device 300 includes a plurality of data lines 301, a plurality of scanning lines 302, which are mutually-perpendicular, and the thin film transistor 1 which is installed at the cross section of these data lines 301 with the scanning lines 302. A gate electrode 50 included in the thin film transistor 1 is connected to the scanning line 302, the source electrode 20a is connected to the data line 301 and the drain electrode 20b is connected a pixel (an individual electrode) 401 described later.

As shown in FIG. 5, the electrophoretic display portion 400 includes a pixel 401, a micro capsule 402, a transparent electrode (a common electrode) 403 and a transparent substrate 404 which are sequentially deposited on the substrate 500.

The micro capsule 402 is fixed between the pixel electrode 401 and the transparent electrode 403 by a binder member 405.

The pixel electrode 401 is divided as being regularly arranged in a matrix. The capsule 402 includes an electrophoretic dispersion liquid 420, which includes different kinds of plurality of electrophoretic particles. Namely, electrophoretic particles 421 and 422 have different charges and colors (color phases.)

In the electrophoretic display device 200, a selection signal (selection voltage) is supplied to one or more scan lines 302, a thin-film transistor 1 that is coupled to the scan lines 302 supplied with the selection signal (selection voltage) turns ON. This switching makes data lines 301 that are coupled to the thin-film transistor 1 be electrically connected to the pixel electrode 401. Here, if certain data (voltage) are supplied to the data lines 301, the data (voltage) are supplied to the pixel electrode 401. This supplying data voltage generates an electric field between the pixel electrode 401 and the transparent electrode 403. The electrophoretic particles 421 and 422 move electrophoretically in a direction toward either electrode depending on the direction and strength of the electric field and properties of the electrophoretic particles 421 and 422.

Meanwhile, if the supply of a selection signal (selection voltage) to the scan lines 302 is stopped, the thin-film transistor 1 turns OFF, cutting off the electrical connection between the data lines 301 and the pixel electrode 401 coupled to the thin-film transistor 1. Accordingly, by supplying or stopping the selection signal to the scan lines 302 and by supplying or stopping data to the data lines 301 in appropriate combination, a desirable image (information) is displayed on a display side (the transparent substrate 404 side) of the electrophoretic display device 200. In particular, in the electrophoretic display device 200 of the embodiment, the electrophoretic particles 421 and 422 have different colors each other, making it possible to display multiple grayscale images.

Also, the electrophoretic display device 200 of the embodiment has the active matrix device 300, selectively turning the thin film transistor 1 coupled to the specific scanning line 3020N and OFF. Such structure avoids a cross talk, increases the speed of circuit operation, improving the quality of images (information). Moreover, the electrophoretic display device 200 of the embodiment operates at a low driving voltage and saves electric power.

Under the above structure, a portion including the micro capsule 402, the transparent electrode (the common electrode) 403, the transparent substrate 404 and the binder member 405 is called as a front plane (an electrophoretic sheet). Another portion including the active matrix device 300, the pixel 401 and the substrate 500 is called as a back plane. Here, the opt electric device in which the active matrix provided with the thin film transistor 1 is applied not only to the above electrophoretic display 200, but to a display such as a liquid crystal device, an organic or inorganic EL device and light emission device.

[Electronic Instrument]

The electrophoretic display 200 can be incorporated into various electronic instruments.

[Electronic Paper]

Figure 7:
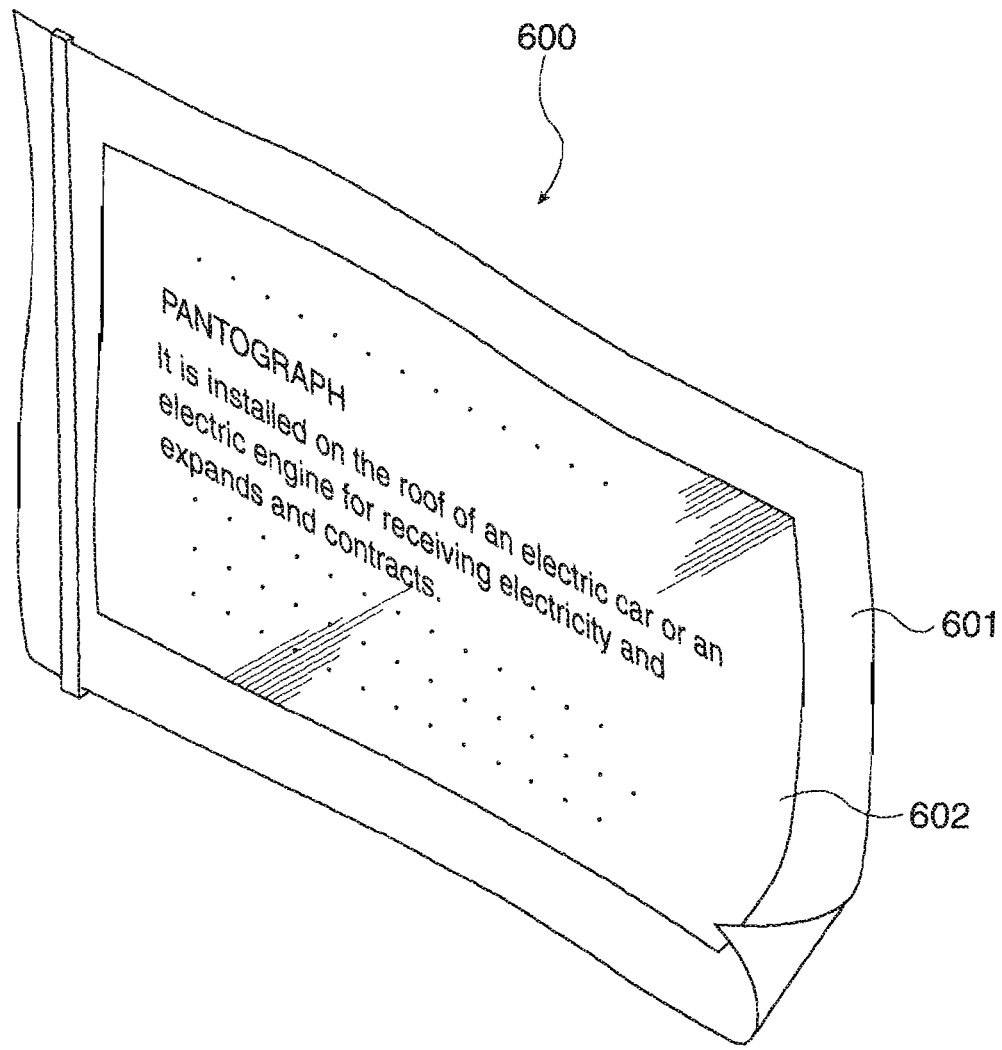
FIG. 7 is a perspective view where the electric apparatus of the invention is applied to an electronic paper.

First, an electronic paper to which an electronic equipment of the invention is applied is described. FIG. 7 shows a perspective view where the electronic equipment of the invention is applied to an electronic paper. In this figure, an electronic paper 600 includes a body 601 and a display unit 602. The body 601 is made of a rewritable sheet having a texture and flexibility like paper. In the electronic paper 600, the display unit 602 includes the electrophoretic display 200.

[Display]

Figure 8A:
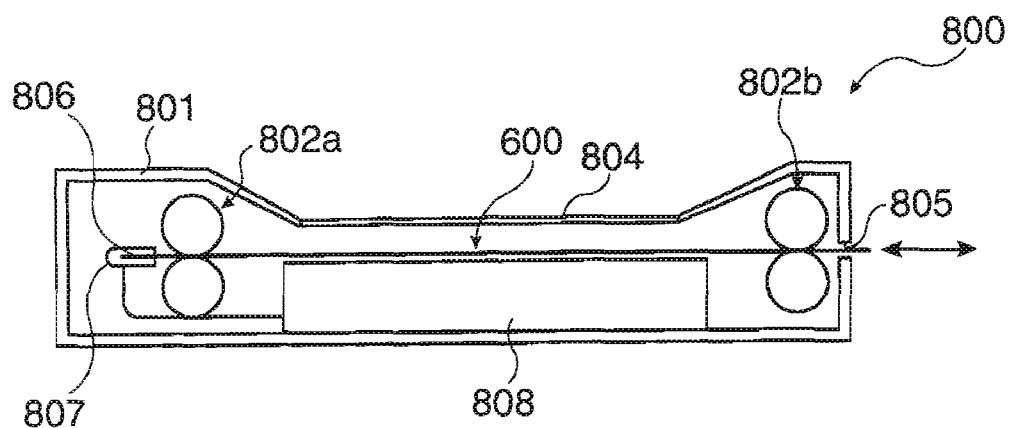
FIG. 8 is a perspective view where the electric apparatus of the invention is applied to a display.
Figure 8B:
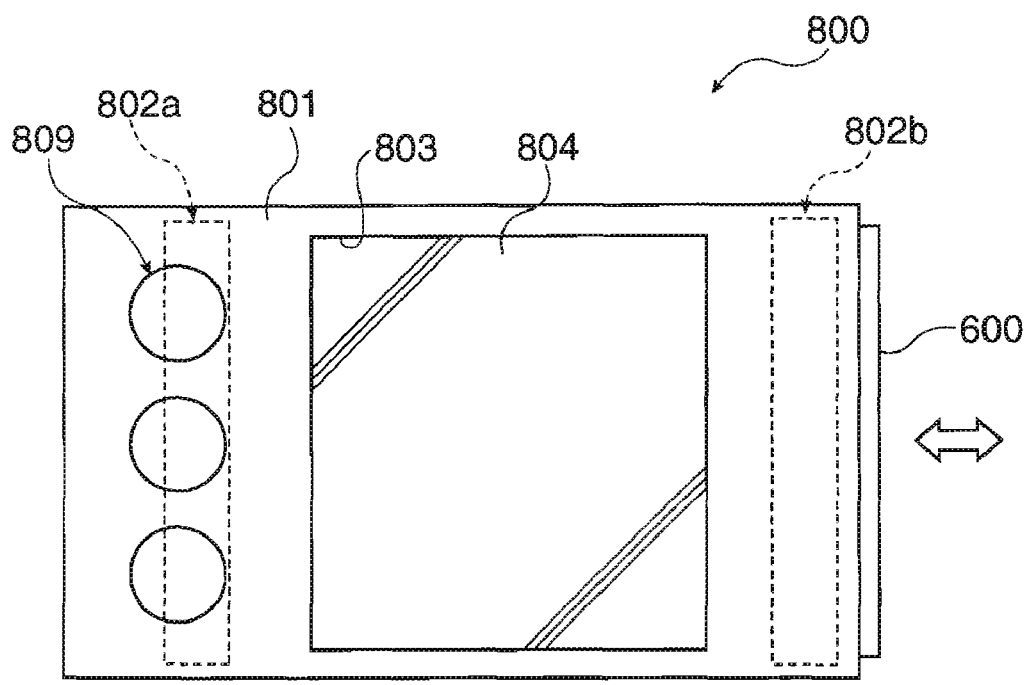

Next, a display to which an electronic equipment of the invention is applied is described. FIGS. 8A and 8B are a cross section and a plan view respectively, showing perspective views where the electronic equipment of the invention is applied to a display. In this figure, a display 800 includes a body 801 and an electronic paper 600 that is detachably provided to the body 801. The electronic paper 600 has the above-mentioned structure, that is, the one shown in FIG. 7.

The body 801 has an insertion slot 805 on its side (right in the figure) into which the electronic paper 600 is inserted. The body 801 also has a pair of feed rollers 802a and 802b inside. When the electronic paper 600 is inserted through the insertion slot 805 into the body 801, the electronic paper 600 is fed into the body 801, being sandwiched by the pair of feed rollers 802a and 802b.

The body 801 also has a rectangular opening 803 on the display side of the body 801 (front side in FIG. 8B). A transparent glass plate 804 is fitted in the opening 803. Accordingly, the electronic paper 600 fed into the body 801 is visible from the outside of the body 801. In other words, the display 800 has a display by making the electronic paper 600 fed into the body 801 visible through the transparent glass plate 804.

Also, a terminal 806 is provided at an end in the direction toward which the electronic paper 600 is injected (left in the figure). Inside the body 801, the terminal 806 is coupled to a socket 807 with the electronic paper 600 being fed into the body 801. The socket 807 is electrically coupled to a controller 808 and a control part 809. In this display 800, the electronic paper 600 is detachably fed into the body 801, and can be used out of the body 801 for portable use. In the display 800, the electronic paper 600 includes the electrophoretic display 200.

Examples of electronic equipment according to the invention are not limited to the above-mentioned, and include TV sets, finder-view sets, direct-view video recorders, car navigation systems, pagers, electronic notebooks, calculators, electronic newspapers, word processors, personal computers, workstations, videophones, point-of-sale devices, touch-sensitive panel devices, and so on. The electrophoretic display 200 is applicable to the display for various types of these electric apparatuses.

Exemplary embodiments of the invention with respect to an electric device, a method of manufacturing an electric device were explained in the above, but the invention is not limited to these embodiments. Furthermore, each of components of the electric apparatuses of the invention can be substituted by a given element that has a function of similar to the above-mentioned, and a given structure may be added to the above-mentioned.

EXAMPLES

Specific examples of the present invention will now be described.

Preparation of the Nonconjugated Compound

The following compounds (1) and (2) were prepared as the nonconjugated compound. $CF_3(CF_2)_9(CH_2)_2CH(CH_2SH)_2$ (1) $CF_3(CF_2)_9(CH_2)_2SH$ (2)

The compound (1) is synthesized by the following method.

[Synthesizing the Compound (1)]

First, the tetra hydrafuran (THF) 250 ml and dimethylformamide (DMF) 75 ml are mixed sodium hydride (NaH) 150 mmol is solved in a solvent under the argon atmosphere at 0° C. to have a solution. The solvent is a mixture of tetra hydrafuran (THF) 250 ml and dimethylformamide (DMF) 75 ml. Next, malonic diethylester (CH2(COOCH2CH3)2) 150 ml is slowly added to the solution.

Then, after this mixture is beaten for fifteen minutes at room temperature, bromo perfluoro orthdecane ($CF_3(CF_2)_9$ $(CH_2)_2Br$) 50 mmol is added to the mixture and the mixture is heated with being refluxed for two hours. Next, this reaction liquid is condensed under a reduced pressure to obtain a oil-like residue, then water 100 ml is added to the residue. Next, pentane, pentane/diethylether(1/1) are extracted in this order from the mixture.

Next, an collected organic layer is cleaned with water and dried with magnesium sulfate, then an organic solvent is removed. Next, an obtained crude product is distilled to attain 2-perfluoro dodecyl malonic diethylester ($CF_3(CF_2)_9(CH_2)_2$ $CH(COOCH_2CH_3)_2$). Next, the 2-perfluoro dodecyl malonic diethylester 8.66 mol is solved into the tetra hydrafuran liquid. Then the lithium aluminum hydride (LAH) 34.6 mmol is added into the solution under a room temperature and this reaction liquid is heated with being refluxed for two hours Next, the 1M hydrochloric acid 150 ml is added to the reaction liquid to stop the reaction, and then the liquid is beaten for thirty minutes. Further, this water layer is extracted with diethyl ether. Next, an obtained organic layer is cleaned by dilute hydrochloric acid and concentrated brine in this order and dried with magnesium sulfate. Then, the organic solvent is removed to obtain 2-perfluoro dodecyl propane-1, 3-diol ($CF_3 (CF_2)_9(CH_2)_2CH(CH_2OH)_2$).

Next, the 2-perfluoro dodecyl propane-1,3-diol 7.83 mmol and the triethylamine 19.6 mmol are solved into tetra hydrafuran to have a solution. Next, the solution is beaten while methanesulfonyl chloride [$CH_3SO_2Cl$] 19.6 mmol is dropped for more than fifteen minutes. Then the solution is further beaten after dropping.

Next, iced water 100 ml is added to this reaction liquid and the excess methanestulfonyl chloride is deactivated. Further, this water layer is obtained and extracted with diethyl ether. Next, an obtained organic layer is cleaned by dilute hydrochloric acid, water, sodium hydrogen carbonate and water in this order and dried with magnesium sulfate. Then, the organic solvent is removed to obtain 2-perfluoro dodecyl propane-1,3-dimesylate ester ($CF_3$ $(CF_2)_9(CH_2)_2CH$ $(CH_2O_3SCH_3)_2$). Next, the 2-perfluoro dodecyl propane-1,3-dimesylate ester 6.79 mmol and the thioacetic potassium 6.79 mmol are solved into the ethanol 100 ml under the argon gas atmosphere to have a solution and the solution is heated at 70° C. for six hours. Further, water 100 ml is added to the reaction liquid and the mixture is extracted with diethyl ether.

Next, a collected organic layer is cleaned with water and dried with magnesium sulfate. Further, an obtained crude product is solved into tetra hydrafuran and the lithium aluminum hydride (LAH) 27.2 mmol is added to the solution at a room temperature. Next, the mixture is refluxed with being heated for two hours. Then, the reaction is stopped by mixing ethanol (which is degassed in advance by bubbling with argon gas). Next, the mixture is beaten for ten minutes and 1M hydrochloric acid is added to the mixture to adjust its PH to PH1. Further, this water layer is extracted with diethyl ether. Next, a collected organic layer is cleaned with dilute hydrochloric acid and concentrated brine in this order and dried with magnesium sulfate, and then an organic solvent is removed. Next, the obtained crude product is refined with hexan as an elute by silica gel chromatography so as to obtain the 2-perfluoro dodecyl propane-1,3-dithiol (the compound (1)).

Manufacturing Thin Film Transistors

First Example

First, a substrate made of polycarbonate is prepared, cleaned with water and dried. Next, a resist layer is formed by photolithography on a region except the region for forming the source electrode and the drain electrode. Then, a gold thin film is formed by evaporation on the surface of the substrate, which is a side of the resist layer. Then the resist layer is removed. This process formed the source electrode and the drain electrode of which an average thickness is 100 nm.

Next, the surface of the substrate, which is a side of the source and drains electrodes, is treated with oxygen plasma. The conditions of the oxygen plasma treatment are the followings: Introduced gas: Pure oxygen gas. Amount of gas flow: 100 sccm. RF power: 0.05 W/cm² Treatment period: Three hundred seconds Atmospheric temperature: 25° C. Atmospheric pressure: $1 \times 10^{-1}$ Pa.

Next, the substrate on which the source and the drain electrodes are formed was dipped in the butyl acetate solution 0.1 mM of the compound (1) (a liquid for forming the organic film) during 0.05 minutes. The temperature of the liquid for forming the organic film is 20° C. This process formed the organic film on the surface of the source electrode and the drain electrode. The numbers of the compound (I) coupled to the surface of the source electrode and the drain electrode are $0.01 \times 10^{15}$ pieces/cm².

The numbers of the compound (1) coupled to the surface of the source and the drain electrodes were measured by a quarts crystal microbalance (QCM), a scanning probe microscope (SPM) and the like. The distance (the channel length) between the source electrode and the drain electrode on which the organic film is formed is 20 μm and the channel width is 1 mm.

Subsequently, a 1% wt/vol toluene solution of fluorene-bithiophene co polymer (F8T2) was applied on the polycarbonate substrate by spin coating at 2400 rpm for 60 seconds, and the substrate was dried at 60 degrees centigrade for 10 minutes. The process formed the organic semiconductor film of which an average thickness is 50 nm. Subsequently, a 5% wt/vol toluene solution of polymethylmethacrylate (PMMA) was applied on the organic semiconductor film by spin coating at 2400 rpm for 60 seconds, and the substrate was dried at 60 degrees centigrade for 10 minutes. Subsequently, a 2% wt/vol butanol solution of polyvinyl phenol (PVP) was applied on the above treated layer by spin coating at 2400 rpm for 60 seconds, and the substrate was dried at 60 degrees centigrade for 10 minutes. This process formed the double gate insulation layers of which an average thickness is 500 nm. Next, an Ag micro particles dispersed liquid was applied by an inkjet method to the region on the gate insulation layer, which corresponds to the region between the source and the drain electrodes and the substrate was dried at 80 degrees centigrade for 10 minutes. This process formed the gate electrode of which an average thickness is 100 nm and an average width is 30 μm.

Second to Eight Examples

In these examples, a period for dipping the substrate into the liquid for the organic layer is changed as shown in the table 1. More than such changes, the same processes in the example 1 are applied to form the thin film transistors.

[First comparison]

The compound (2) is used as the organic film instead of the compound (1). More than this replacement, the same processes in the example 5 are applied to for the thin film transistor 1.

[Second comparison]

Forming the organic film is omitted. More than this omission, the same processes in the above example are applied to for the thin film transistor.

Evaluation

Carrier mobility, S values and ON/OFF ratios were measured for thin film transistors in the above examples. Here, the S value was a gate voltage required to add a drain current value Id to the next digit.

The drain current value Id was measured by changing the gate voltage when the potential between the source and the drain electrode is 40V. The two measurements were preformed; one was under a nitride atmosphere directly after manufacturing a thin film transistor and the other was under the air after 40 V voltage is applied to the gate electrode for six minutes (stress charge.) The results of the measurements are listed in Table 1.

TABLE 1

| | Liquid for forming Organic film | | | Numbers of nonconjugated organic compound coupled to electrode surface($\times 10^{15}$ | Carrier mobility ($\times 10^{-3}$cm$^2$/Vs) | | S value [V] | | On Off Ratio [$\times 10^4$] | |
|---|---|---|---|---|---|---|---|---|---|---|
| | Kinds of nonconjugated organic compound | Density [mM] | Dipping Time (minutes) | pieces/cm$^2$) | Nitrogen | Atmosphere | Nitrogen | Atmosphere | Nitrogen | Atmosphere |
| Example1 | Compound1 | 0.1 | 0.05 | 0.01 | 1.4 | 0.06 | 1.5 | 1.7 | 55 | 2.0 |
| Example2 | Compound1 | 0.1 | 0.5 | 0.13 | 1.5 | 0.06 | 1.3 | 1.4 | 60 | 2.0 |
| Example3 | Compound1 | 0.1 | 3 | 0.39 | 2.2 | 0.3 | 1.2 | 1.2 | 80 | 10 |
| Example4 | Compound1 | 0.1 | 5 | 0.68 | 4.4 | 4.0 | 1.0 | 1.0 | 160 | 130 |
| Example5 | Compound1 | 0.1 | 30 | 0.83 | 4.5 | 4.4 | 1.0 | 1.0 | 180 | 170 |
| Example6 | Compound1 | 0.1 | 100 | 0.93 | 2.5 | 2.2 | 1.1 | 1.1 | 100 | 80 |
| Example7 | Compound1 | 0.1 | 200 | 0.95 | 1.5 | 1.1 | 1.3 | 1.3 | 60 | 40 |
| Example8 | Compound1 | 0.1 | 270 | 0.97 | 1.4 | 1.1 | 1.8 | 2.0 | 55 | 40 |
| Comparison1 | Compound2 | 0.1 | 30 | 0.91 | 4.2 | 0.25 | 1.0 | 1.2 | 150 | 8.4 |
| Comparison2 | | | | | 1.3 | 0.05 | 2.4 | 2.5 | 50 | 1.7 |

Every value in the table 1 is an average of two hundreds thin film transistors. As shown in the table 1, the characteristics of thin film transistors in which the organic film is formed on the surface of the electrode (examples and the first comparison) are improved. The value of S in particular, comparing to the thin film transistors in which the organic film is not formed (the second comparison.) These characteristics of thin film transistors are maintained well even after they received a stress load.

Further, setting appropriate numbers of nonconjugated organic compounds coupled to the surface of the source and the drain electrodes shows the tendency of improving the characteristics of the thin film transistors. In particular, the thin film transistors in the examples 4 and 5 indicated supreme characteristics. On the other hand, thin film transistors in the comparisons showed lowering the ON/OFF ratios after they received a stress load. Further, the thin film transistor in the comparison 2 remarkably showed lowering carrier mobility.

The entire disclosure of Japanese Patent Application No. 2005-380424, Dec. 28, 2005 is expressly incorporated by reference herein.

What is claimed is:

1. An electric device comprising:
   a first electrode;
   a second electrode;
   an organic semiconductor film disposed between the first electrode and the second electrode; and
   an organic film disposed between the first electrode and the semiconductor film, such that the organic film is disposed on at least a side surface of the first electrode, the organic film including a plurality of nonconjugated organic compounds, each of the plurality of nonconjugated organic compounds having a coupling group that is coupled with the first electrode, wherein
   a number of the plurality of nonconjugated organic compounds that is coupled to the surface of the first electrode is from $0.50 \times 10^{15}$ to $0.92 \times 10^{15}$ pieces/cm$^2$.

2. The electric device according to claim 1, further comprising:
   a gate electrode that is applying an electric field to the organic semiconductor film, the first electrode being one of a source and a drain electrode.

3. The electric device according to claim 1, the first electrode having a plurality of first portions and a plurality of second portions, the plurality of first portions being coupled with the plurality of nonconjugated organic compounds, the plurality of second portions not being coupled with the plurality of nonconjugated organic compounds.

4. The electric device according to claim 3, each of the plurality of nonconjugated organic compounds including a structure that has hydrophobicity at the opposite side of the coupling group of the each of the plurality of nonconjugated organic compounds.

5. The electric device according to claim 4, each of the plurality of nonconjugated organic compounds being expressed as the general formula: $CF_3(CF_2)_m(CH_2)$, $CH(CH_2SH)_2$, wherein m is integers from one to thirty five and n is integers from two to thirty three.

6. The electric device according to claim 5, wherein the ratio of m/n satisfies the numbers from 0.25 to 18 in the general formula.

7. The electric device according to claim 1, the coupling group being a SH group.

8. The electric device according to claim 1, each of the plurality of nonconjugated organic compounds having a substitution group that is adopted to supply electric charges to the organic semiconductor film, the substitution group of one of the plurality of nonconjugated organic compounds being disposed at the opposite side of the coupling group of the one of the plurality of nonconjugated organic compounds.

9. The electric device according to claim 8, a maximum thickness of the organic film being smaller than a length between the coupling group of the one of the plurality of nonconjugated organic compounds and the substitution group of the one of the plurality of nonconjugated organic compounds.

10. The electric device according to claim 1, each of the plurality of nonconjugated organic compounds including carbons of which total numbers are 4 to 45.

11. The electric device according to claim 1, the first electrode and the organic semiconductor film not directly contacting to each other by the organic film that is disposed between the first electrode and the organic semiconductor film and that separates the first electrode and the organic semiconductor film.

12. The electric device according to claim 1, the first electrode including at least one of Au, Ag, Cu, and Pt.

13. An electric apparatus comprising the electric device according to claim 1.

14. An method of manufacturing an electric device having a first and a second electrodes and an organic semiconductor film that is disposed between the first and the second electrodes, comprising:
forming an organic film at least on the first electrode, such that the organic film is disposed on at least a side surface of the first electrode, the organic film including a plurality of nonconjugated organic compounds, each of the plurality of nonconjugated organic compounds having a coupling group that is coupled with the first electrode; and
forming the organic semiconductor film over the organic film, wherein
a number of the plurality of nonconjugated organic compounds that is coupled to the surface of the first electrode is from $0.50 \times 10^{15}$ to $0.92 \times 10^{15}$ pieces/cm$^2$.

15. The method of manufacturing an electric device according to claim 14, further comprising:
cleaning at least the surface of the first electrode with oxygen plasma before the process of forming the organic film.

16. The method of manufacturing an electric device according to claim 14, the process of forming the organic film including contacting at least the first electrode and a liquid material for 0.1 to 200.0 minutes to form the organic film at least on the first electrode, the liquid material including a plurality of nonconjugated organic compounds with a density of 0.01 to 10 mM.

17. An method of manufacturing an electric device having a first and a second electrodes and an organic semiconductor film that is disposed between the first and the second electrodes, comprising:
forming an organic film at least on the first electrode, such that the organic film is disposed on at least a side surface of the first electrode, the organic film including a plurality of nonconjugated organic compounds, each of the plurality of nonconjugated organic compounds having a coupling group that is coupled with the first electrode;
forming the organic semiconductor film over the organic film; and
cleaning at least the surface of the first electrode with oxygen plasma before the process of forming the organic film.

* * * * *